United States Patent
Lupo et al.

(10) Patent No.: US 7,486,708 B2
(45) Date of Patent: Feb. 3, 2009

(54) METHOD AND SYSTEM FOR STABILIZING OPERATION OF LASER SOURCES

(75) Inventors: Silvio Lupo, Turin (IT); Giuseppe Achille Azzini, Cremona (IT); Giuseppe Fornero, Turin (IT)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 83 days.

(21) Appl. No.: 11/586,921

(22) Filed: Oct. 26, 2006

(65) Prior Publication Data

US 2007/0098415 A1  May 3, 2007

(30) Foreign Application Priority Data

Nov. 1, 2005   (GB)   ................... 0522250.0

(51) Int. Cl.
*H01S 3/13* (2006.01)
(52) U.S. Cl. ............... 372/29.02; 372/38.02; 372/38.07
(58) Field of Classification Search ............ 372/29.02, 372/38.02, 38.07
See application file for complete search history.

(56) References Cited

U.S. PATENT DOCUMENTS

| 6,907,055 | B2 | 6/2005 | Morley et al. |
|---|---|---|---|
| 2003/0007525 | A1* | 1/2003 | Chen ............... 372/31 |
| 2005/0190804 | A1 | 9/2005 | Robinson et al. |
| 2005/0286575 | A1 | 12/2005 | Hattori et al. |
| 2006/0165139 | A1* | 7/2006 | Sanchez ............... 372/29.021 |
| 2006/0189511 | A1* | 8/2006 | Koblish et al. ............. 514/2 |

\* cited by examiner

*Primary Examiner*—Dung T Nguyen

(57) ABSTRACT

A system for stabilizing an output optical power from a laser source against drifts induced by temperature and/or aging, said output optical power including a target optical-modulation amplitude around a target average value includes:

Figure 3:
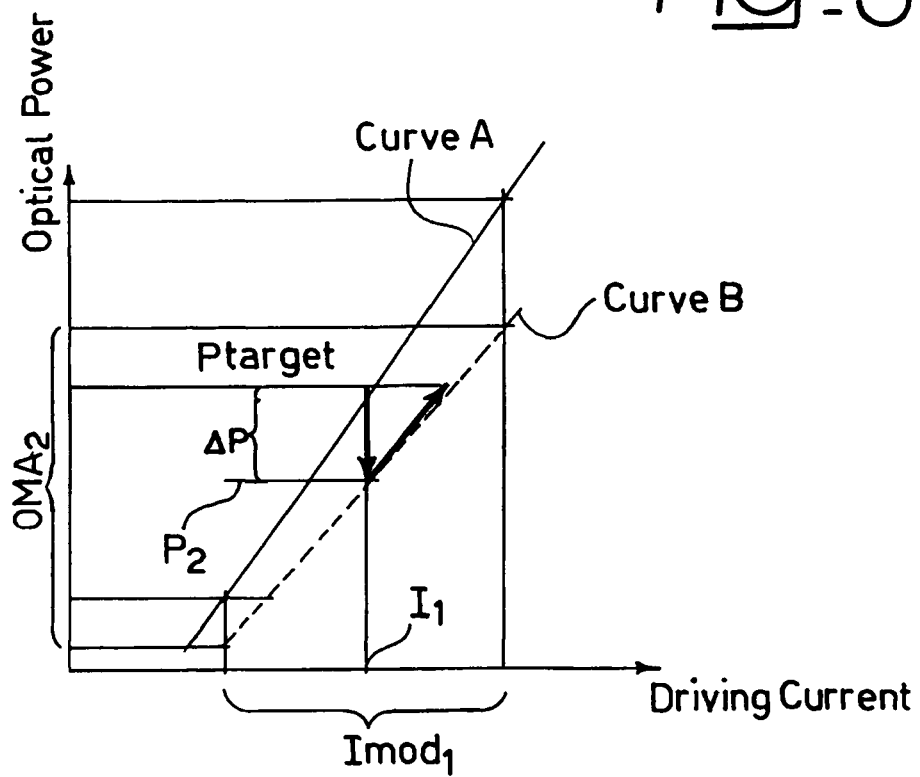

a power sensor for sensing the output optical power from the laser source and generating a power sensing signal indicative thereof, and a controller sensitive to the power sensing signal and configured for selectively adjusting the bias ($I_B$) and modulation ($I_M$) currents of the laser source by: detecting an error between the actual average output optical power from the laser source and the target average value, comparing the error against a given error threshold, and when the error reaches the threshold adjusting the bias ($I_B$) and modulation ($I_M$) currents to bring the output optical power from the laser source (1) back to the target average value ($P_{target}$) and the target optical modulation amplitude ($OMA_{target}$) around the target average value ($P_{target}$).

8 Claims, 3 Drawing Sheets

Fig_1
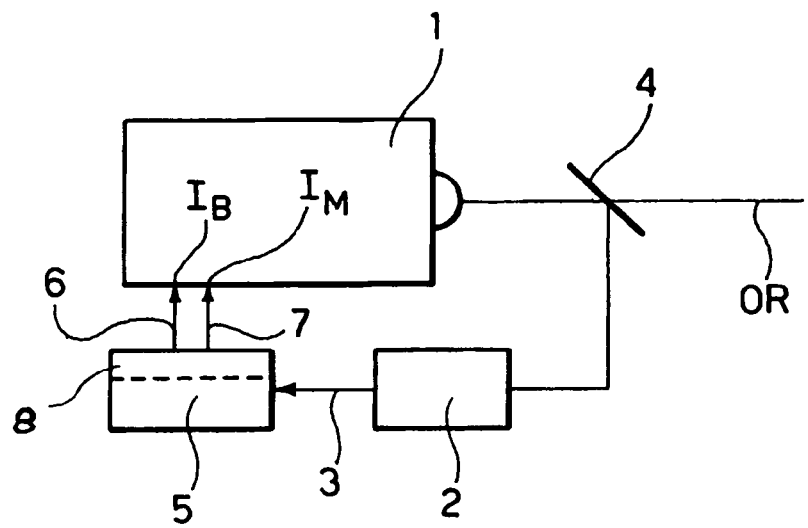
Fig_2
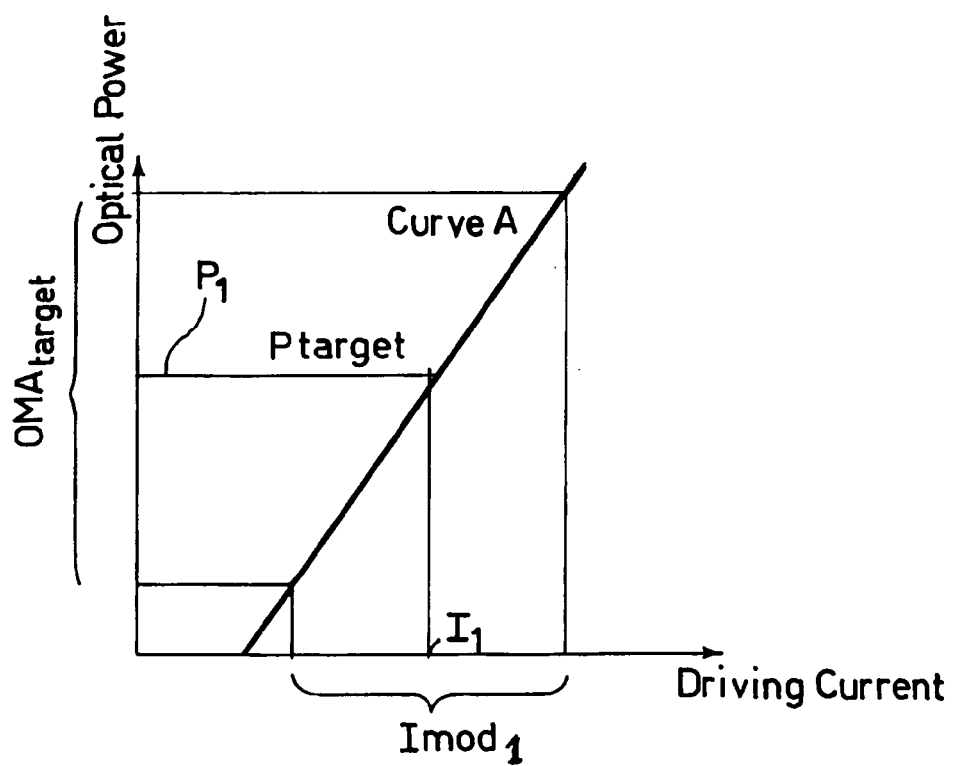

METHOD AND SYSTEM FOR STABILIZING OPERATION OF LASER SOURCES

FIELD OF THE INVENTION

The invention relates to techniques for stabilizing operation of laser sources such as those used e.g. in optical fiber communication links.

DESCRIPTION OF THE RELATED ART

In laser optical communication links, the need arises of stabilizing against temperature and aging the so-called "eye-shape". This designation currently indicates the pattern obtained by displaying on an oscilloscope screen the traces generated by the "0s" and "1s" comprising a data flow transmitted over the link. In general terms, an eye-shape "wide open" corresponds to optimum performance of the transmitter.

Prior art arrangements exists that counter the negative effects of temperature on the eye-shape (average power and Extinction Ratio ER) by resorting to Automatic Power Control (APC) circuitry or optical power stabilization. These prior art arrangements require characterization of the behaviour of the laser source against temperature for modulation control and are generally unable to compensate aging effects.

Alternative modulation control arrangements for eye-shape stabilisation exist that involve the use of a pilot tone. These arrangements add to the circuital complexity of the system, and the pilot tone present in the optical power may undesirably interfere with transmitted data and/or other tones.

OBJECT AND SUMMARY OF THE INVENTION

The need is therefore felt for arrangements that permit the optical eye-shape (average power and ER) to be maintained against temperature fluctuations and laser aging without requiring characterization over temperature during the laser module set-up and, preferably, without requiring additional circuitry.

The object of the invention is thus to provide a response to such a need. According to the present invention, that object is achieved by means of a method having the features set forth in the annexed claims. The invention also relates to a corresponding system. The claims are an integral part of the disclosure of the invention provided herein.

In brief, an embodiment of the invention is a method of stabilizing an output optical power from a laser source against drifts induced by at least one of temperature and aging, wherein the output optical power from the laser includes a target optical modulation amplitude ($OMA_{target}$) around a target average value ($P_{target}$). This method includes the steps of:
  applying to the laser source selectively variable bias and modulation currents, and
  controlling the bias and modulation currents by:
  detecting an error between the actual average output optical power from the laser source and the target average value ($P_{target}$),
  comparing the error against a given error threshold, and
  when the error reaches the threshold, adjusting the bias and modulation currents to bring the output optical power from the laser source back to said target average value ($P_{target}$) and said target optical modulation amplitude ($OMA_{target}$) around said target average value ($P_{target}$).

An embodiment of the invention permits the optical eye-shape to be maintained against temperature fluctuations and laser aging without a characterisation over temperature during module set-up. Additionally, the present embodiment of the invention relies on a specific algorithm implemented in a micro-controller to properly set modulation and bias current amplitudes without requiring any additional specific circuit.

BRIEF DESCRIPTION OF THE ANNEXED DRAWINGS

Figure 4:
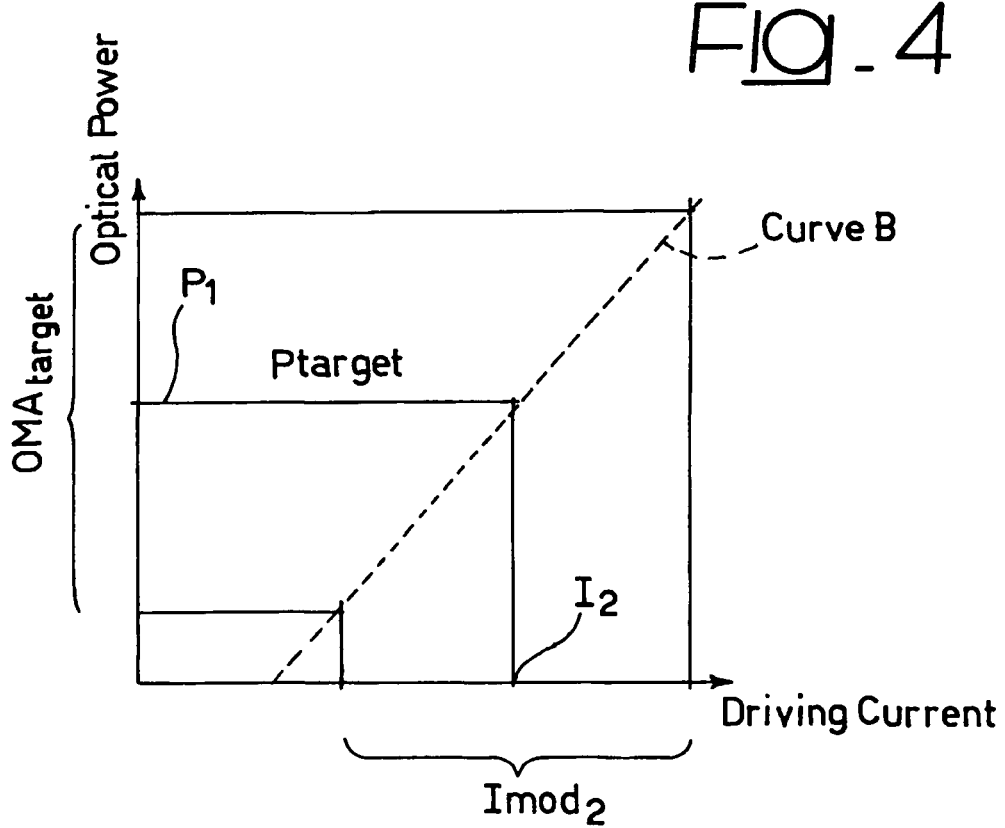
Figure 5:
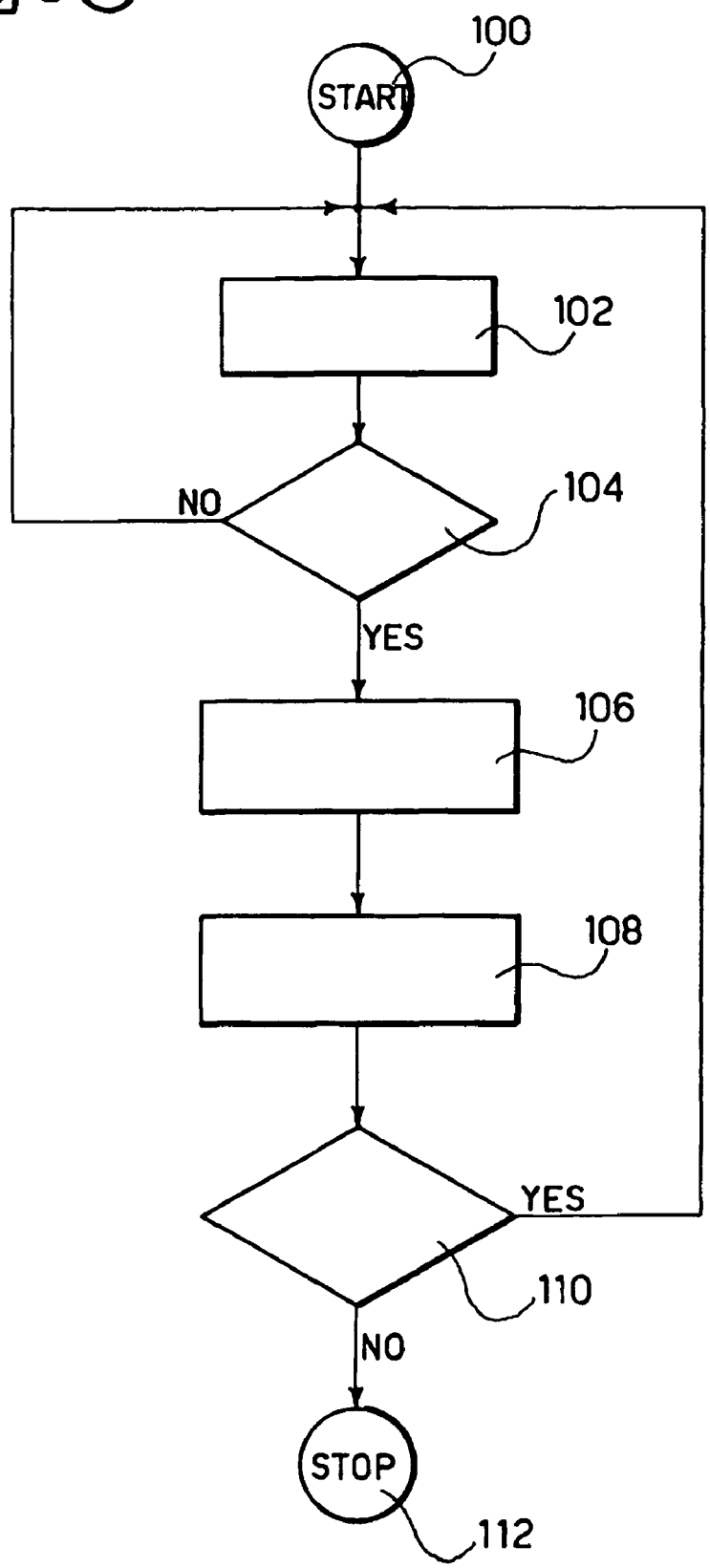

The invention will now be described, by way of example only, with reference to the annexed figures of drawing, wherein:

FIG. 1 is a schematic block diagram of an arrangement including a laser source having associated modules for stabilizing operation of the laser source, FIGS. 2 to 4 are diagrams exemplary of operation of the arrangement illustrated in FIG. 1, and FIG. 5 is a flow chart representative of operation of the arrangement described herein.

DETAILED DESCRIPTION OF PREFERRED EMBODIMENTS OF THE INVENTION

In FIG. 1, reference 1 denotes a laser source of any known type (e.g. DFB) as currently used in laser optical communications. The laser source 1 has an associated power sensing module 2 adapted to produce over an output line 3 a signal representative of the power of the optical radiation OR as emitted by the laser source 1. For that purpose, a semi-reflective mirror 4 is interposed in the path of the radiation OR to "split" a (very small) portion of that radiation and direct it into the sensing module 2. This typically includes an opto-electrical converter (such as a photodiode or phototransistor) that converts the optical radiation fed into the module 2 into a corresponding electrical signal.

Sensing arrangements as just described are common in the art as used e.g. in so-called "wavelength-locker" arrangements. These include a wavelength-sensitive module adapted to sense any variation in the wavelength of the radiation emitted by the laser source and feed a wavelength-control loop to restore the emitted wavelength at the desired nominal value. Such a wavelength-locker arrangement also includes a module for sensing the power of the emitted radiation and generate a signal indicative thereof. This power signal is used to normalize the wavelength sensitive signal in order to avoid that operation of the wavelength-locker arrangement may be adversely affected by changes in the optical power emitted by the laser.

Those of skill in the art will promptly appreciate that the arrangement illustrated, including a semi-transparent mirror to split power from the optical radiation OR, is merely exemplary of a number of different arrangements adapted to be used for that purpose. For instance, alternative arrangements are known in the art where sensing of the power associated with the optical radiation OR emitted by the laser 1 (from the "front" facet thereof) is performed without interfering with the optical radiation OR. In such alternative arrangements the laser output power is sensed on the basis of radiation captured at the "back" facet of the laser source.

Similarly, those of skill in the art will appreciate that words such as "optical", "light", and so on are used herein according to the current usage in the area of laser optic communications and related areas. Consequently, the captioned wording is in no way limited to radiation in the visible spectrum and also extends e.g. to radiation in the infrared (IR) and ultraviolet (UV) ranges.

The power detection module 2 typically also includes an A/D converter so that the power sensing signal produced on the line 3 is in digital form. This renders such signal adapted to be fed to a microcontroller 5. The microcontroller 5 is in turn configured for controlling, via output lines designated by 6 and 7, respectively, the bias current ($I_B$) and the modulation current ($I_M$) of the laser source 1. This typically occurs via a laser driver circuitry—of a known type—indicated as whole by reference numeral 8.

During operation of a laser source at certain temperature and aging levels, the optical power v. driving current relationship is dictated by a curve such as the curve designated by Curve A in FIG. 2. Essentially, the driving current may be seen as comprised as the combination of a bias component $I_1$ having superposed thereon a modulation component that causes the driving current to "swing" over a range designated $Imod_1$.

Correspondingly, the optical power from the laser 1 correspondingly includes a level $P_1$ corresponding to the input current $I_1$ and representing a "target" level $P_{target}$ for the optical power having superposed thereon a variable component which gives a rise to variations of the optical power over a desired "target" Optical Modulation Amplitude (OMA) range designated $OMA_{target}$.

As schematically shown in FIG. 3, temperature variations and/or aging essentially produce a shift in the laser properties such as to cause the optical power v. driving current relationship being represented by a "new" curve, designated Curve B, in the place of Curve A. As illustrated herein, both Curve A and Curve B are essentially straight lines, with Curve B exhibiting a lower angular slope with respect to Curve A and an higher current threshold. Additionally, Curve B generally lies "below" Curve A when temperature increases and for aging in that lower values of optical power are produced for the same values of the driving current in the case of Curve B.

The practical result of the shift of the device characteristics from Curve A to Curve B can be directly appreciated from FIG. 3: if the driving current ($I_1+Imod_1$) is kept unchanged, the optical power from the laser 1 will exhibit an average value $P_2$ generally lower than the expected "target" value $P_{target}$. Additionally, the optical modulation amplitude will be shifted to a range indicated by $OMA_2$, which is "narrower" and "lower" than the "target" range $OMA_{target}$. This will in turn correspond to the optical eye diagram becoming gradually "less open" with a consequent degradation in ER performance of the link.

The arrangement described herein is based on the recognition the optical power from the laser 1 can be restored to the original performance (thus effectively countering the negative effects of temperature and/or aging) by suitably modifying the bias current ($I_B$) and the modulation current ($I_M$) as schematically shown in FIG. 4.

Essentially, the bias current $I_B$ is (re)adjusted to a new (typically increased) value $I_2$ which translates (via the relationship dictated by Curve B) into an average output power level $P_1$ corresponding to the desired value $P_{target}$. Similarly, the modulation current $I_M$ is regulated to produce a modulation range designated $Imod_2$ which translates (via the relationship dictated by Curve B) into an optical modulation amplitude (OMA) range corresponding to the desired range $OMA_{target}$.

The microcontroller 5 switches the driving current behaviour from the conditions shown in FIG. 2 to the conditions shown in FIG. 4 via the output lines 6 and 7 on the basis of the power sensing signal received over the line 3 from the detection module 2.

Preferably, the control arrangement described herein does not correct (i.e. re-adjust) the driving current until the power error, namely the difference between the target value $P_{target}$ and the actual value of the average output $P_2$ from the laser (see FIG. 3) is below a fixed threshold, $\Delta P$. When such a threshold is reached, the controller 5 adjusts bias current $I_B$ to $I_2$ in order to restore the average power level to $P_{target}$. The "new" modulation current range $Imod_2$ required to obtain the desired target value $OMA_{target}$ can be easily calculated by the microcontroller 5 as:

$$Imod_2 = OMA_{target} \cdot (I_2 - I_1)/(P_{target} - P_2)$$

where:
$Imod_2$ is the new value of the modulation range,
$OMA_{target}$ is the target optical modulation amplitude,
$I_2$ is the current value of the bias current, after correction
$I_1$ is the bias current value before the correction,
$P_{target}$ is the target average value for the average optical power for the laser source 1, and
$P_2$ is the value of the average output optical power from the laser source 1 before the correction.

The flow chart of FIG. 5 is exemplary of operation of the arrangement described previously.

After a start step 100, a step 102 is representative of the microcontroller 5 monitoring the power sensing level received over the line 3 from the power sensing module 2.

In a step 104, the microcontroller 5 checks whether the absolute value of the power error (($AbS(P_{target}-P_2)$), see FIG. 3, has reached the threshold $\Delta P$. If the threshold has not been reached (negative outcome of the step 104), the microcontroller 5 loops back to the step 102.

If, due to temperature and/or aging effects, the power error threshold is reached (positive outcome of the step 104) in a step 106 the micro-controller 5 adjusts the bias current $I_B$ to $I_2$ as previously described and stores $I_1$ and $P_2$ values.

In a step 108, the microcontroller calculates the modulation current $Imod_2$ of the laser source 1.

The step designated by 110 is representative of a check possibly made by the microcontroller 2 as to ascertain whether the stabilization action is to be continued or not.

In the negative, the system evolves to a stop condition 112 waiting to be re-activated. Alternatively, if the stabilization action is to be continued (positive outcome of step 110) operation of the system loops back to the step 102.

It will be appreciated that the arrangement described herein is effective not only for shifting the laser behaviour from Curve A to Curve B as described in the foregoing. The same arrangement will also be effective for shifting to other curves and/or for possibly shifting backwards from Curve B to Curve A as possibly required by decrease in temperature.

The arrangement described herein does not merely perform a power control stabilization action as possibly achieved by ensuring that a pre-determined average output power level is maintained. The arrangement described herein ensures that the overall behavior of the output power from the laser source (average level—plus—the optical modulation amplitude or OMA) is stabilized against the effects of temperature and/or aging.

Consequently, without prejudice to the underlying principles of the invention, the details and embodiments may vary, even significantly, with the respect to what has been described and illustrated, by way of example only, without departing from the scope of the invention as defined by the annexed claims.

What is claimed is:

1. A method of stabilizing an output optical power from a laser source against drifts induced by at least one of temperature and aging, said output optical power including a target optical modulation amplitude ($OMA_{target}$) around a target average value ($P_{target}$), the method including the steps of:

applying to said laser source selectively variable bias ($I_B$) and modulation ($I_M$) currents, and controlling said bias ($I_B$) and modulation ($I_M$) currents by:

detecting an error between an actual average output optical power ($P_2$) from the laser source and said target average value ($P_{target}$), comparing said error against a given error threshold ($\Delta P$), and when said error reaches said threshold ($\Delta P$), adjusting said bias ($I_B$) and modulation ($I_M$) currents to bring the output optical power from said laser source back to said target average value ($P_{target}$) and said target optical modulation amplitude ($OMA_{target}$) around said target average value ($P_{target}$).

2. The method of claim 1, further comprising, when said error reaches said threshold ($\Delta P$), it includes the steps of:

adjusting said bias current ($I_B$) from a current value ($I_1$) to a target value ($I_2$), said bias current target value ($I_2$) corresponding to said target average value ($P_{target}$) of the output optical power from the laser source (1), and adjusting the modulation range of said modulation current ($I_M$) to a new value ($Imod_2$) defined as:

$Imod_2 OMA_{target} \cdot (I_2 - I_1)/(P_{target} - P_2)$ where:

$Imod_2$ is said new value of the modulation range, $OMA_{target}$ is said target optical modulation amplitude ($OMA_{target}$), $I_2$ is said current value of said bias current, $I_1$ is said bias current target value before correction, $P_{target}$ is said target average value ($P_{target}$), and $P_2$ is the value of the average output optical power from the laser source before correction.

3. A system for implementing a method of stabilizing an output optical power from a laser source against drifts induced by at least one of temperature and aging, said output optical power including a target optical modulation amplitude ($OMA_{target}$) around a target average value ($P_{target}$), the method including the steps of: applying to said laser source selectively variable bias ($I_B$) and modulation ($I_M$) currents and controlling said bias ($I_B$) and modulation ($I_M$) currents by: detecting an error between an actual average output optical power ($P_2$) from the laser source and said target average value ($P_{target}$), comparing said error against a given error threshold ($\Delta P$), and when said error reaches said threshold ($\Delta P$) adjusting said bias ($I_B$) and modulation ($I_M$) currents to bring the output optical power from said laser source back to said target average value ($P_{target}$) and said target optical modulation amplitude ($OMA_{target}$) around said target average value ($P_{target}$); wherein said system comprises:

a power sensor for sensing the output optical power from said laser source and generating a power sensing signal indicative thereof, and a controller sensitive to said power sensing signal and configured for selectively adjusting said bias ($I_B$) and modulation ($I_M$) currents of the laser source, said controller being further configured for performing operations of detecting said error, comparing said error against said error threshold ($\Delta P$) and adjusting said bias ($I_B$) and modulation ($I_M$) currents.

4. The system of claim 3, further comprising laser driver circuitry interposed between said controller and said laser source for selectively adjusting said bias ($I_B$) and modulation ($I_M$) currents of said laser source.

5. The system of either of claim 3, wherein said controller includes a microcontroller.

6. The system of claim 3, wherein said controllers having stored therein software code portions for performing said steps of detecting, comparing and adjusting.

7. The system of claim 3, wherein said power sensing modules includes an A/D converter for feeding said power sensing signal into said controller in digital form.

8. The system of claim 3, further comprising a semi-reflective element for splitting power from the optical power generated by said laser source to feed said power sensing module.

* * * * *

UNITED STATES PATENT AND TRADEMARK OFFICE
CERTIFICATE OF CORRECTION

PATENT NO. : 7,486,708 B2
APPLICATION NO. : 11/586921
DATED : February 3, 2009
INVENTOR(S) : Silvio Lupo, Giuseppe Achille Azzini and Giuseppe Fornero It is certified that error appears in the above-identified patent and that said Letters Patent is hereby corrected as shown below:

Column 5, Line 26, Claim 2, delete "$Imod_2 OMA_{target}(I_2-I_1)/(P_{target}-P_2)$ and insert --$Imod_2 = OMA_{target}(I_2-I_1)/(P_{target}-P_2)$--.

Signed and Sealed this
First Day of February, 2011

David J. Kappos
*Director of the United States Patent and Trademark Office*